US008063886B2

(12) United States Patent
Serban et al.

(10) Patent No.: US 8,063,886 B2
(45) Date of Patent: Nov. 22, 2011

(54) DATA INPUT DEVICE

(75) Inventors: Bogdan Serban, Leudelange (LU);
Philippe Boyer, Cattenom (FR); Aloyse Schoos, Bertrange (LU)

(73) Assignee: IEE International Electronics & Engineering S.A., Luxembourg (LU)

( * ) Notice: Subject to any disclaimer, the term of this patent is extended or adjusted under 35 U.S.C. 154(b) by 1434 days.

(21) Appl. No.: 11/488,241

(22) Filed: Jul. 18, 2006

(65) Prior Publication Data
US 2008/0018608 A1 Jan. 24, 2008

(51) Int. Cl.
*G06F 3/41* (2006.01)
(52) U.S. Cl. .......................... 345/173; 345/178
(58) Field of Classification Search .............. 345/104,
345/173–181, 204–210; 349/155, 156; 359/291;
178/18.06, 18.05; 324/686; 341/34; 338/4;
73/777, 721, 708, 760, 828; 257/414
See application file for complete search history.

(56) References Cited

U.S. PATENT DOCUMENTS

| | | | |
|---|---|---|---|
| 3,896,425 A | | 7/1975 | Erichsen |
| 3,960,044 A | * | 6/1976 | Nagai et al. ................ 84/719 |
| 4,311,980 A | * | 1/1982 | Prudenziati ................ 338/4 |
| 4,345,167 A | * | 8/1982 | Calvin ...................... 327/517 |
| 4,587,378 A | | 5/1986 | Moore |
| 4,725,817 A | * | 2/1988 | Wihlborg .................... 341/34 |
| 5,357,806 A | * | 10/1994 | Dennis et al. ............... 73/718 |
| 5,386,219 A | * | 1/1995 | Greanias et al. ............ 345/174 |
| 5,852,487 A | * | 12/1998 | Fujimori et al. ............ 349/162 |
| 5,861,558 A | * | 1/1999 | Buhl et al. .................. 73/777 |
| 5,945,605 A | * | 8/1999 | Julian et al. ................ 73/727 |
| 6,249,130 B1 | | 6/2001 | Greer |
| 6,378,381 B1 | * | 4/2002 | Okada et al. ............ 73/862.043 |
| 6,499,351 B1 | * | 12/2002 | Enomoto et al. ............ 73/708 |
| 6,531,951 B2 | | 3/2003 | Serban et al. |
| 6,657,614 B1 | * | 12/2003 | Ito et al. ................... 345/168 |
| 6,681,638 B2 | * | 1/2004 | Kazerooni et al. .......... 73/760 |
| 6,930,672 B1 | * | 8/2005 | Kuribayashi ............... 345/173 |
| 7,064,650 B2 | | 6/2006 | Bieck et al. |
| 7,258,015 B1 | * | 8/2007 | Shaw et al. ................ 73/708 |
| 7,634,949 B2 | * | 12/2009 | Lodge et al. ............... 73/828 |
| 7,886,613 B2 | * | 2/2011 | Lodge et al. ............... 73/828 |
| 2002/0149572 A1 | * | 10/2002 | Schulz et al. .............. 345/174 |
| 2002/0149834 A1 | * | 10/2002 | Mei et al. .................. 359/295 |
| 2003/0214003 A1 | * | 11/2003 | Kurtz ........................ 257/414 |

(Continued)

FOREIGN PATENT DOCUMENTS

EP 0 430 676 6/1991
(Continued)

OTHER PUBLICATIONS

International Search Report; PCT/EP2007/057387; Feb. 4, 2008.
(Continued)

*Primary Examiner* — Prabodh Dharia
(74) *Attorney, Agent, or Firm* — Cantor Colburn LLP

(57) ABSTRACT

A data input device with a film-based pressure sensor including a first carrier film, a second carrier film and a spacer. The spacer has an opening delimiting an active zone, in which first and second electrodes are arranged such that, in response to a compressive force, an electrical contact is established. A control circuit able to operate in at least a first and a second mode is configured to measure, in the first mode a quantity indicative of electrical resistance and, in the second mode, a quantity indicative of a capacitance.

33 Claims, 9 Drawing Sheets

U.S. PATENT DOCUMENTS

| | | |
|---|---|---|
| 2004/0163939 A1 | 8/2004 | Bieck et al. |
| 2005/0052429 A1* | 3/2005 | Philipp .................... 345/173 |
| 2005/0104653 A1* | 5/2005 | Hoshi et al. ............... 327/544 |
| 2006/0001655 A1 | 1/2006 | Tanabe |
| 2006/0139036 A1* | 6/2006 | Gutendorf ................ 324/686 |
| 2006/0158433 A1 | 7/2006 | Serban et al. |
| 2006/0207806 A1* | 9/2006 | Philipp ................. 178/18.05 |
| 2006/0209050 A1 | 9/2006 | Serban |
| 2007/0074914 A1* | 4/2007 | Geaghan et al. ........ 178/18.06 |
| 2007/0085837 A1* | 4/2007 | Ricks et al. ............... 345/173 |
| 2007/0085838 A1* | 4/2007 | Ricks et al. ............... 345/173 |
| 2008/0018608 A1* | 1/2008 | Serban et al. ............. 345/173 |
| 2008/0018611 A1* | 1/2008 | Serban et al. ............. 345/173 |
| 2008/0135385 A1* | 6/2008 | Steeneken et al. ......... 200/181 |
| 2008/0202251 A1* | 8/2008 | Serban et al. ............... 73/780 |
| 2010/0020039 A1* | 1/2010 | Ricks et al. ............... 345/173 |
| 2010/0107770 A1* | 5/2010 | Serban et al. ............... 73/718 |
| 2010/0127992 A1* | 5/2010 | Schmid ..................... 345/173 |
| 2010/0295812 A1* | 11/2010 | Burns et al. ............... 345/174 |

FOREIGN PATENT DOCUMENTS

| | | |
|---|---|---|
| WO | WO 2004/049364 | 6/2004 |
| WO | WO 2006/008246 | 1/2006 |
| WO | WO 2006/008247 | 1/2006 |

OTHER PUBLICATIONS

Joshua Smith, et al.; "Electric Field Sensing for Graphical Interfaces"; Computer Graphics I/O Devices; May/Jun. 1998; pp. 54-60.

* cited by examiner

DATA INPUT DEVICE

FIELD OF THE INVENTION

This invention relates to data input devices and more particularly to data input devices including a film-based pressure sensor for human-device interaction.

BACKGROUND OF THE INVENTION

Data input devices are commonly used in conjunction with electronic appliances to feed them with various kinds of data, including e.g. control data influencing directly or indirectly the behavior of the appliance, data that are processed by the appliance and/or simply stored.

It is known to construct data input devices based upon film-type pressure sensors. A film-type pressure sensor comprises two carrier films, which are arranged at a certain distance from one another by means of a spacer. The spacer is provided with at least one opening that defines an active zone of the sensor, in which the two carrier films face one another. Inside this active zone, at least two electrodes are arranged in such a way on the carrier films, that electrical contact is established between the electrodes when the two carrier films are pressed together under the action of a compressive force acting on the sensor in the active zone.

Depending on the application of such a pressure sensor, a layer of semiconducting material may be disposed between the electrodes, so that the sensor shows a gradual pressure sensitive behavior, that is to say its resistance varies gradually or even continuously as a function of the force applied. The layer of semiconducting material may comprise a material whose internal electrical resistance varies as a function of compression or of deformation of the layer or a material whose surface structure confers to the layer a surface resistance that is reduced following an increase in the number of points of contact with a conducting surface of an electrode, against which the layer of semiconducting material is pressed under the action of the compressive force.

WO 2004/049364 relates to a data input device comprising several keys arranged in at least two rows. A unidirectional position detector of film-type construction is associated with each row of keys Each unidirectional position sensor enables the detection of the actuated key along the direction of the unidirectional position detector. The unidirectional position sensors are interconnected in such a way that a control circuit can detect in which row a key has been actuated.

A different kind of sensors is based upon capacitive sensing. U.S. Pat. No. 3,896,425 discloses an electrical proximity detector that senses the changes in the contents of a defined sensitive volume. The detector comprises an antenna that is driven by an oscillator and that emits an electric field into the sensitive volume. A person or an object intruding into the sensitive volume causes a change of the electric field of the antenna, which is detected by the detector. To shape the electric field of the antenna the detector comprises a first shield, driven by the oscillator with a signal of same amplitude and phase as the signal of the antenna, and a second, grounded shield.

Other sensors based on electric field or "capacitive" sensing have been proposed by J. Smith et al. in "Electric Field Sensing for Graphical Interfaces", IEEE Computer Graphics and Applications, Issue May/June 1998, 54-60, as a human-computer interface. The interfaces are based upon an array of electrodes to detect the gestures of a user.

The above-mentioned documents are herewith included herein by reference.

SUMMARY OF THE INVENTION

The invention provides an improved data input device.

The invention further provides an improved method for operating a data input device.

A data input device is provided with a film-based pressure sensor comprising a first carrier film, a second carrier film and a spacer arranged between the carrier films for keeping them at a distance from one another. The spacer has an opening delimiting an active zone, in which first and second electrodes are arranged in such a way that, in response to a compressive force acting on the active zone, an electrical contact is established between the first and second electrodes. A control circuit able to operate in at least a first and a second mode of operation is configured so as to measure, in the first mode of operation, a quantity indicative of electrical resistance between the first and second electrodes for detecting an amount or a position of a compressive force acting on the active zone and, in the second mode of operation, a quantity indicative of a capacitance for detecting a person or an object approaching thereto. It should be noted that the terms "first" and "second" are primarily used for denoting the modes of operation and that the terms should not be understood as indicating an order of the modes of operation in time. The control circuit may operate in the first mode of operation before or after operating in the second mode of operation. For instance, the control circuit could first operate in the second mode of operation and switch to the first mode of operation only if a person or object approaching the active zone has been detected.

According to a first aspect of the invention the first carrier film has a first electrode applied thereon and the second carrier film has a second electrode applied thereon. The first and second electrodes face each other in the active zone in such a way that, in response to compressive force acting on the pressure sensor at the active zone, the first and second carrier films are pressed together and an electrical contact is established between the first and second electrodes. The control circuit is configured so as to measure, in the first mode of operation, a quantity indicative of electrical resistance between the first and second electrodes for detecting an amount of compressive force acting on the active zone and, in the second mode of operation, a quantity indicative of the capacitance of a capacitor formed by the first electrode and its surroundings, for detecting a person or an object approaching thereto. For sake of conciseness, we use the phrase "capacitance of the first electrode" instead of "capacitance of a capacitor formed by the first electrode and its surroundings". The surroundings of the first electrode may for instance comprise a part of a user's body, such as their hand or finger. The quantity indicative of capacitance can be any physical quantity that is linked to the capacitance by the laws of physics, such as, for instance, amplitude of a current, amplitude of a voltage or impedance. For instance, amount of current that flows into the first electrode for a given voltage applied to the latter depends on and is therefore indicative of the capacitance the first electrode.

The data input device according to the first aspect of the invention preferably comprises a first module for measuring the quantity indicative of electrical resistance, dedicated to the first mode of operation, and a second module for measuring the quantity indicative of a capacitance of the first electrode, dedicated to the second mode of operation.

The first module can, for instance, comprise a current source operationally connected, in the first mode of operation, to the first and second electrodes so as to create a current through the first and second electrodes if an electrical contact is established between the first and second electrodes, and a voltage measurement circuit operationally connected, in the first mode of operation, to the first and second electrodes for measuring a voltage between them, the voltage being indicative of electrical resistance between the first and second electrodes. Alternatively or additionally, the first module can comprise a voltage source operationally connected, in the first mode of operation, to the first and second electrodes for creating a voltage between them and a current measurement circuit operationally connected, in the first mode of operation, for measuring a current flowing through the first and second electrodes, the current being in this case indicative of electrical resistance between the first and second electrodes.

The second module can, for instance, include an AC voltage source operationally connected, in the second mode of operation, at least to the first electrode for applying an oscillating voltage to the first electrode and a current measurement circuit operationally connected, in the second mode of operation, for measuring an electrical current flowing into the first electrode, the electrical current flowing into the first electrode being indicative of a capacitance of the first electrode. Preferably, the AC voltage source is operationally connected, in the second mode of operation, to the first and second electrodes so as to apply voltages of substantially same phase and amplitude to the first and second electrodes. In this case, the potential difference between the first and the second electrodes remains close to zero, so that the second electrode shields the first electrode.

The data input device according to the first aspect of the invention advantageously comprises a switching unit switching the control circuit between at least the first and second modes of operation.

It will be appreciated that the first and/or the second electrode may comprise a pressure sensitive layer, e.g. a semiconducting layer arranged in facing relationship with the respective other one of the first and second electrodes in the active zone. The pressure sensitive layer may comprise a material whose internal electrical resistance varies as a function of compression or of deformation or a material whose surface structure confers to the layer a surface resistance that is reduced following an increase in the number of points of contact with a conducting surface of an electrode, against which the layer of semiconducting material is pressed under the action of a compressive force.

Preferably, the control circuit is configured so as to output a first output signal responsive to the quantity indicative of electrical resistance and a second output signal responsive to the quantity indicative of a capacitance of the first electrode. The control circuit may comprise, for instance, a first and a second output and be configured so as to output the first output signal at the first output and the second output signal at the second output.

The first and second electrodes are usually formed integrally but according to a variant of the invention, the first electrode is subdivided into at least two electrode portions. In this case, the at least two electrode portions may be electrically separated at least in the second mode of operation so that the quantity indicative of a capacitance of the first electrode can be determined separately for each one of the at least two electrode portions.

According to a second aspect of the invention a method is proposed for operating a data input device as described above. Such a method comprises the measuring of a quantity indicative of electrical resistance between the first and second electrodes for detecting an amount of compressive force acting on the active zone and the measuring of a quantity indicative of a capacitance of the first electrode for detecting a person or an object approaching thereto. Preferably, the measuring of a quantity indicative of a capacitance of the first electrode includes applying an oscillating voltage to the first electrodes and measuring an electrical current flowing into the first electrode in response to the applied oscillating voltage. Most preferably, the measuring a quantity indicative of a capacitance of the first electrodes includes applying an oscillating voltage to the second electrode, the oscillating voltage applied to the second electrode having substantially same phase and amplitude as the oscillating voltage applied to the first electrode.

A third aspect of the invention concerns a data input device with a film-based pressure sensor of slightly different configuration. According to the third aspect of the invention, the first carrier film has a first electrode and a second electrode applied thereon; the second carrier film has a third electrode applied thereon. The first and second electrodes face the third electrode in the active zone in such a way that, in response to a compressive force acting on the active zone, the first and second carrier films are pressed together and an electrical contact is established between the first and second electrodes via the third electrode. This data input device further comprises a control circuit able to operate in at least a first and a second mode of operation, the control circuit being configured so as to measure, in the first mode of operation, a quantity indicative of electrical resistance between the first and second electrodes for detecting an amount of compressive force acting on the active zone and, in the second mode of operation, a quantity indicative of a capacitance of at least one of the first, second and third electrodes for detecting a person or an object approaching thereto. The at least one of the first, second and third electrodes preferably designates, for instance, the first electrode, the first and second electrodes, or the third electrode.

A data input device according to the third aspect of the invention may also comprise a first module for measuring the quantity indicative of electrical resistance, dedicated to the first mode of operation, and a second module for measuring the quantity indicative of a capacitance dedicated to the second mode of operation.

The first module may comprise, for instance a current source operationally connected, in the first mode of operation, to the first and second electrodes so as to create a current through the first and second electrodes if an electrical contact is established between the first and second electrodes via the third electrode, and a voltage measurement circuit operationally connected, in the first mode of operation, to the first and second electrodes for measuring a voltage between them, the voltage being indicative of electrical resistance between the first and second electrodes. Alternatively or additionally, the first module may comprise a voltage source operationally connected, in the first mode of operation, at the first and second electrodes for creating a voltage between them and a current measurement circuit operationally connected, in the first mode of operation, for measuring a current flowing through the first and second electrodes, the current being indicative of electrical resistance between the first and second electrodes.

The second module preferably includes an AC voltage source operationally connected, in the second mode of operation, at least to the at least one of the first, second and third electrodes for applying an oscillating voltage to the at least one of the first, second and third electrodes and a current measurement circuit operationally connected, in the second mode of operation, for measuring an electrical current flowing into the at least one of the first, second and third electrodes, the electrical current flowing into the at least one of the first, second and third electrodes being indicative of a capacitance of the at least one of the first, second and third electrodes. Most preferably, this AC voltage source is operationally connected to the first, second and third electrodes so as to apply voltages of substantially same phase and amplitude to the first, second and third electrodes, in the second mode of operation.

The data input device according to the third aspect of the invention may further comprise a switching unit switching the control circuit between at least the first and second modes of operation.

Advantageously, at least one of the first, second and third electrodes comprises a pressure sensitive layer arranged in facing relationship with a respective other one or respective other ones of the first, second and third electrodes in the active zone.

The control circuit is preferably configured so as to output a first output signal responsive to the quantity indicative of electrical resistance and a second output signal responsive to the quantity indicative of a capacitance of the at least one of the first, second and third electrodes. Most preferably, the control circuit comprises at least a first and a second output, the control circuit being configured so as to output the first output signal at the first output and the second output signal at the second output.

As in the data input device according to the first aspect, the electrodes in the data input device according to the third aspect of the invention are normally formed integrally. Nevertheless, the at least one of the first, second and third electrodes can be subdivided into at least two electrode portions that are electrically separated at least in the second mode of operation. In this case, the quantity indicative of the capacitance of the at least one of the first, second and third electrodes can be determined separately for each one of the at least two electrode portions.

According to a fourth aspect of the invention it is proposed a method operating a data input device according to the third aspect of the invention. Such a method comprises the measuring of the quantity indicative of electrical resistance between the first and second electrodes for detecting an amount of compressive force acting on the active zone and the measuring the quantity indicative of a capacitance of the at least one of the first, second and third electrodes for detecting a person or an object approaching thereto. Preferably, the measuring of a quantity indicative of the capacitance of the at least one of the first, second and third electrodes includes applying an oscillating voltage to the at least one of the first, second and third electrodes and measuring an electrical current flowing into the at least one of the first, second and third electrodes in response to the applied oscillating voltage. Most preferably, the measuring of the quantity indicative of a capacitance of the at least one of the first, second and third electrodes includes applying an oscillating voltage to the other one or the other ones of the at least one of the first, second and third electrodes, the oscillating voltage applied to the other one or other ones of the at least one of the first, second and third electrodes having same phase and amplitude as the oscillating voltage applied to the at least one of the first, second and third electrodes.

According to a fifth aspect of the invention a data input device is proposed that comprises a film-based position sensor. The position sensor comprises a first carrier film, a second carrier film and a spacer arranged between the first and second carrier films for keeping the first and second carrier films at a distance from one another, and comprising an opening delimiting an active zone of the position sensor. The first carrier film has a first electrode and a second electrode applied thereon; the second carrier film has a third electrode applied thereon. The first electrode includes a series of resistively connected first conductors. The third electrode faces the first electrode and the second electrode in the active zone in such a way that, in response to a compressive force acting on the active zone, the first and second carrier films are pressed together and an electrical contact is established between one or more of the first conductors and the second electrode via the third electrode. The data input device according to the fifth aspect of the invention further comprises a control circuit able to operate in at least a first and a second mode of operation, the control circuit being configured so as to measure, in the first mode of operation, a quantity indicative of a position of resistive coupling between the first electrode and the second electrode for detecting a position of a compressive force acting on the active zone and, in the second mode of operation, a quantity indicative of a position of capacitive coupling between the first electrode and the second electrode for detecting a position of a person or an object approaching to the data input device.

According to a preferred embodiment of the data input device according to the fifth aspect of the invention, the second electrode comprises a series of conductively connected second conductors, the first and second conductors being arranged so as to interdigitate.

To obtain the position of a compressive force or a capacitive coupling in two dimensions, the film-based position sensor may comprise a plurality of active zones, delimited by an opening or openings of the spacer. The first carrier film has a first electrode and a second electrode applied thereon in each one of the active zones and the second carrier film has a third electrode applied thereon in each one of the active zones. Each first electrode includes a series of resistively connected first conductors. Each third electrode faces its respective first and second electrodes in the respective active zone in such a way that, in response to a compressive force acting on an active zone, the first and second carrier films are pressed together and the third electrodes provides an electrical contact between one or more of the first conductors of the respective first electrode and the respective second electrode. The control circuit is in this case able to operate in at least a first and a second mode of operation and configured so as to measure, in the first mode of operation, a quantity indicative of a position in two dimensions of resistive coupling between said first electrode and said second electrode for detecting a position in two dimensions of a compressive force and, in the second mode of operation, a quantity indicative of a position of capacitive coupling between said first electrode and said second electrode for detecting a position of a person or an object approaching to said data input device.

Data input devices referred to hereinabove include but are not limited to keyboards, keypads, touch screens, touch panels, computer mice, etc. In case of devices with keys, one or several keys may be associated to each active zone of the device. Detecting of the position (in one or in two dimensions) of the compressive force can in this case be considered equivalent to determining which key has been actuated.

BRIEF DESCRIPTION OF THE DRAWINGS

Further details and advantages of the present invention will be apparent from the following detailed description of several not limiting embodiments with reference to the accompanying drawings, wherein.

DESCRIPTION OF PREFERRED EMBODIMENTS

Figure 1:
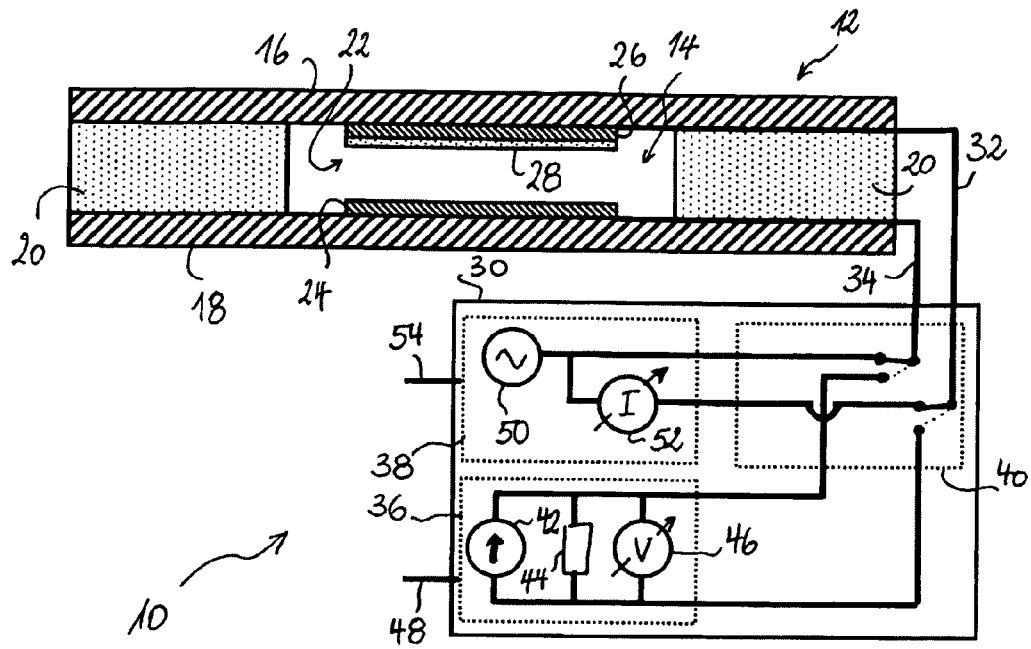
FIG. 1 is a schematic representation of a data input device according to the first aspect of the invention.

FIG. 1 shows a data input device according to the first aspect of the invention. The device 10 comprises pressure sensor 12 of film-type construction with an active zone 14. The pressure sensor 12 comprises first and second carrier films 16, 18, made of substantially flexible, electrically insulating material, such as e.g. PET, PEN, PI or the like. A spacer 20 is sandwiched between the first and second carrier films 16, 18, thereby arranging the carrier films the distance corresponding to the spacer thickness from one another. The spacer can also be made of any substantially flexible, electrically insulating material. The spacer is provided with an opening that delimits the active zone 14 of the pressure sensor 10. In the active zone 14, the first carrier foil 16 carries a first electrode 22 on its inward-facing side, while the second carrier foil 18 carries a second electrode 24 on its inward-facing side. The first electrode 22 comprises a conductive layer 26 applied directly on the first carrier foil 16 and a pressure sensitive layer 28 facing towards the second electrode. The second electrode is provided by a conductive layer. The electrodes are preferably printed ones.

The first and second electrodes 22, 24 are connected to a control circuit 30 by leads 32 and 34. The control circuit 30 comprises a first module 36 for measuring a quantity indicative of electrical resistance between the first and second electrodes 22, 24, a second module 38 for measuring a quantity indicative of the capacitance of the first electrode and a switching unit 40 for connecting alternatively the first or the second module to the electrodes 22, 24.

The first module 38 comprises a current source 42 whose terminals can be connected to the first and second electrodes, respectively, through the switching unit 40. A reference resistor 44 and a voltage measurement circuit 46 are connected in parallel to the current source 42. In operation, i.e. in the first operating mode, the current source tries to create a defined current between its terminals. As long as the electrodes 22 and 24 are separated from each other, i.e. when the compressive force acting on the pressure sensor is not sufficient for pressing the carrier films together in the active zone 14, the current can flow only through the reference resistor 44 because of the very high input impedance of the voltage measurement circuit 46. If however, the electrodes 22 and 24 are in contact, the total resistance connected in parallel to the voltage measurement circuit drops so that the voltage necessary to keep the defined current upright drops. In other words, the potential difference measured by the voltage measurement circuit is indicative of the resistance between the first and second electrodes 22, 24. In response to the measurement, the first module outputs a first signal on the first output 48.

The second module 38, dedicated to the "capacitive" measurement, comprises a AC voltage source 50, providing an oscillating signal to both the first and second electrodes 22, 24 through the switching unit 40. A current measurement circuit 52 measures the current flowing into the first electrode. The amount of current that may flow into the first electrode depends on and is therefore indicative of the capacitance of a capacitor formed by the first electrode and its surroundings. The second module outputs a second signal on the second output 54 of the control circuit, depending on the measured current.

Figure 2:
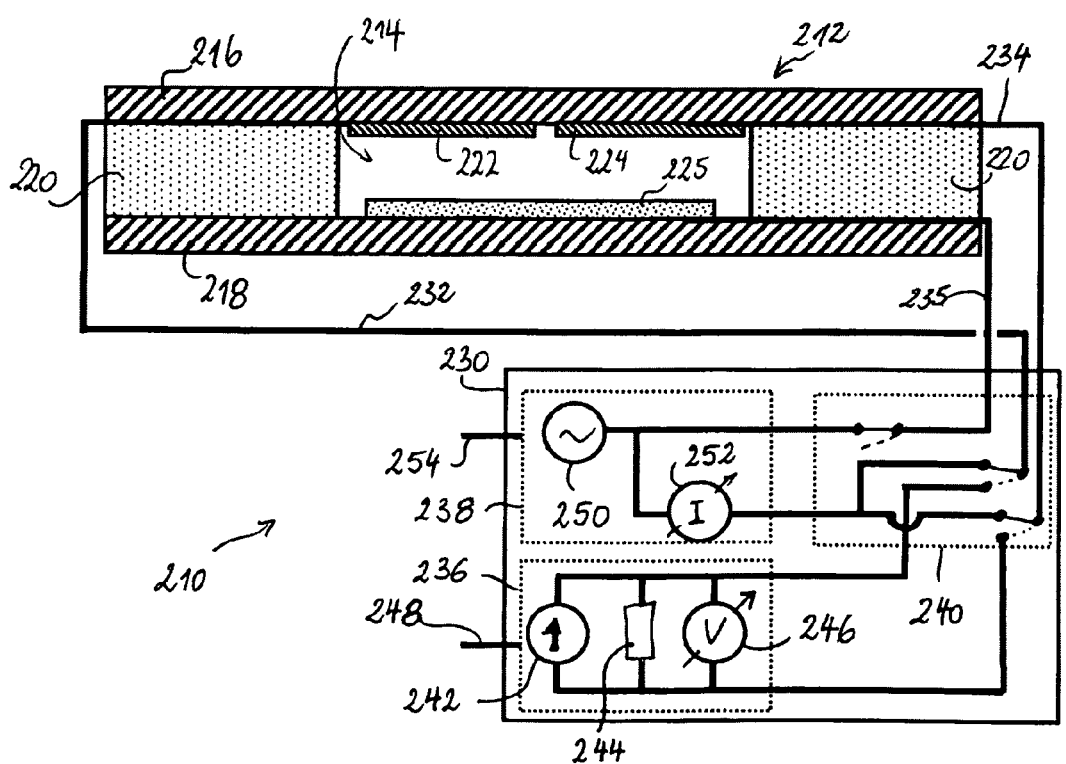
FIG. 2 is a schematic representation of a data input device according to the third aspect of the invention.

FIG. 2 shows a data input device according to the third aspect of the invention The device 210 comprises pressure sensor 212 of film-type construction with an active zone 214. The pressure sensor 212 comprises first and second carrier films 216, 218, made of substantially flexible, electrically insulating material, such as e.g. PET, PEN, PI or the like. A spacer 220 is sandwiched between the first and second carrier films 216, 218, thereby arranging the carrier films the distance corresponding to the spacer thickness from one another. The spacer can also be made of any substantially flexible, electrically insulating material. The spacer is provided with an opening that delimits the active zone 214 of the pressure sensor 210. In the active zone 14, the first carrier foil 216 carries a first electrode 222 and a second electrode 224 on its inward-facing side, while the second carrier foil 218 carries a third electrode 225 on its inward-facing side. The first and second electrodes 222, 224 are provided by a conductive layer applied directly on the first carrier foil 216. The third electrode 225 comprises a pressure sensitive layer facing towards the first and second electrode 222, 224. The electrodes are preferably printed ones.

The electrodes 222, 224, 225 are connected to a control circuit 230 by leads 232, 234 and 235, respectively. The control circuit 230 comprises a first module 236 for measuring a quantity indicative of electrical resistance between the first and second electrodes 222, 224, a second module 238 for measuring a quantity indicative of the capacitance of the first and second electrodes 222, 224 and a switching unit 240 connecting alternatively the first or the second module to the electrodes 222, 224 and 225.

The first module 238 comprises a current source 242 whose terminals can be connected to the first and second electrodes, respectively, through the switching unit 240. A reference resistor 244 and a voltage measurement circuit 246 are connected in parallel to the current source 242. In operation, i.e. in the first operating mode, the current source 242 tries to create a defined current between its terminals. As long as the compressive force acting on the pressure sensor is not sufficient for pressing the carrier films together in the active zone 214, the current can flow only through the reference resistor 244 because of the very high input impedance of the voltage measurement circuit 246. If however, the carrier films are pressed together, both the first electrode 222 and the second electrode 224 gets into contact with the third electrode 225. As a consequence, the total resistance connected in parallel to the voltage measurement circuit 246 drops, so that the voltage necessary to keep the defined current upright drops as well. In other words, the potential difference measured by the voltage measurement circuit 246 is indicative of the resistance between the first and second electrodes 222, 224. In response to the measurement, the first module 236 outputs a first signal on the first output 248. The second module 238, dedicated to the "capacitive" measurement, comprises a AC voltage source 250, providing an oscillating signal to electrodes 222, 224 and 225, through the switching unit 240. A current measurement circuit 252 measures the current flowing into the first and second electrodes 222, 224. The amount of current that may flow into these electrodes depends on and is therefore indicative of the capacitance of a capacitor formed by the first and second electrodes and its surroundings. The second module 238 outputs a second signal on the second output 254 of the control circuit, depending on the measured current.

The data input device may be operated alternately in the mode of operation associated to the resistance measurement and in the mode of operation associated to the "capacitance" measurement. Those skilled will understand that the duration of these measurement modes may be equal or different. Furthermore, the frequencies of the different modes of operation may be equal or different. For instance it is possible that the data input device is operated in the mode of operation associated to the resistance measurement only half often as in the mode of operation associated to the "capacitance" measurement, or vice versa. There may be other modes of operation of the data input device, such as, for instance an error diagnose mode, in which the data input device checks for possible short circuits or circuit interruptions.

Figure 3:
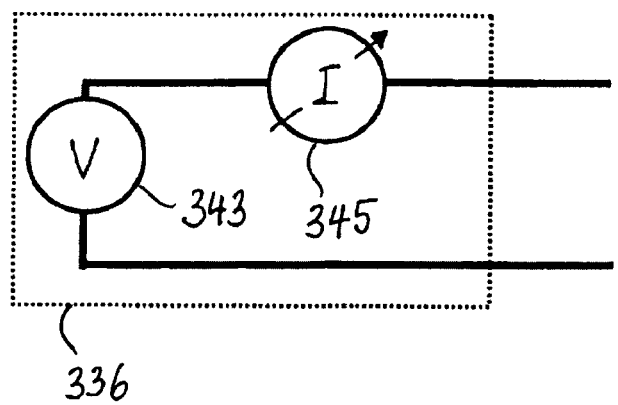
FIG. 3 is an equivalent circuit diagram of a module for measuring a quantity indicative of capacitance.

FIG. 3 shows an alternative embodiment of a module capable of measuring a quantity indicative of resistance between the first and second electrodes. The module 336 comprises a voltage source 343 connected in series with a current measurement circuit 345. In the first measurement mode, the voltage source applies a potential difference between the first and second electrodes. If an electrical contact is established between these, either directly or via a third electrode, the resistance between the electrodes decreases and the current measured by the current measurement circuit increases according to Ohm's law. The module 336 could be substituted to module 36 in FIG. 1 and to module 236 in FIG. 2. Those skilled will be aware of other electric circuits that can measure a quantity indicative of resistance.

Figure 4:
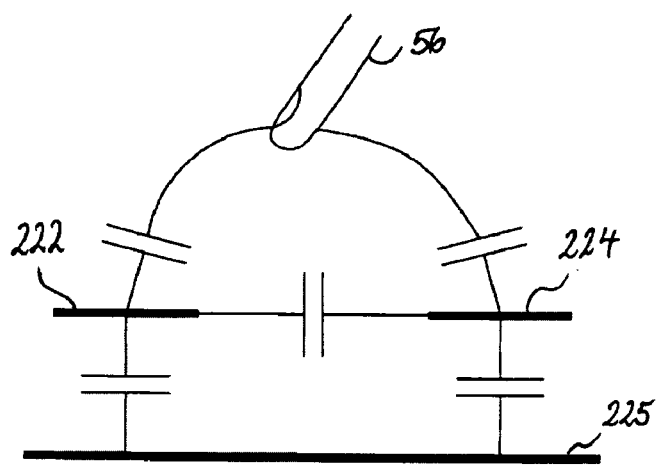
FIG. 4 is an illustration of the capacitances intervening during the measurement of a quantity indicative of capacitance.

FIG. 4 schematically shows the capacitances intervening during the "capacitive" measurement in the case of a data input device 210 as in FIG. 2. Of the data input device 210, only the electrodes 222, 224 and 225 are shown. During the "capacitive" measurement, one measures a quantity indicative of the capacitance formed by the first and second electrodes 222, 224 and their surroundings. As illustrated, a variety of (virtual) capacitors have to be considered. For instance, the first and second electrodes form a capacitor with the third electrode. If a user approaches to the data input device with any portion of their body, e.g. their finger 56, the capacitance of the capacitor formed by the first and second electrodes 222, 224 with the surroundings changes, and this change is detected by the data input device. It should be noted that if the electrodes 222, 224 and 225 are all driven with a signal of same amplitude and phase, they are remain at substantially the same electric potential during the measurement. Consequently, the capacitances of the capacitors formed by the first and second electrodes, the first and third electrodes and the second and third electrodes remain substantially constant. In particular, the third electrode shields the first and second electrodes from changes in the electric field that occur behind the third electrode, as seen from the first and second electrodes.

Figure 5:
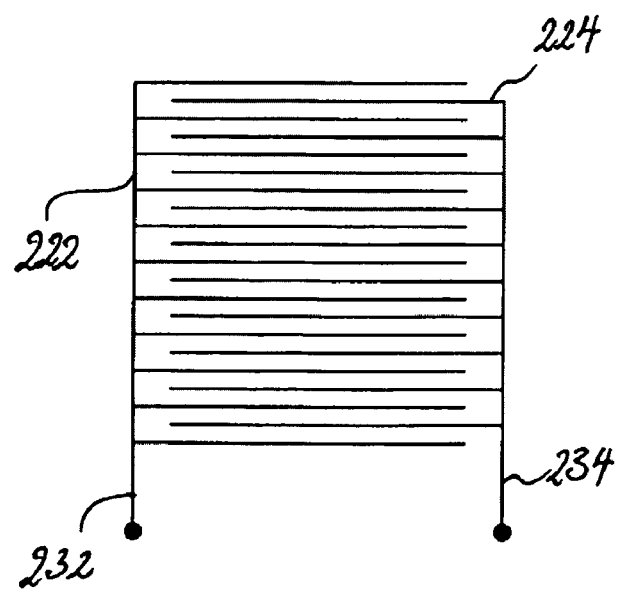
FIG. 5 is an illustration of an example of a possible layout of the first and second electrodes in the device of FIG. 2.
Figure 6:
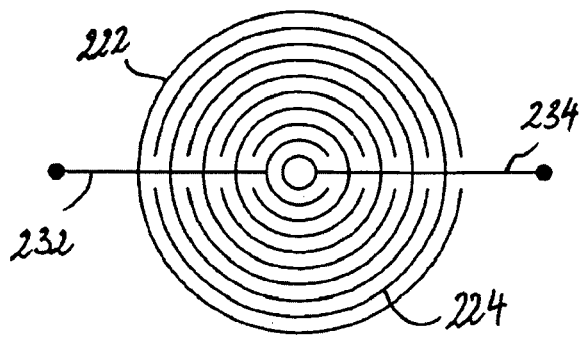
FIG. 6 an illustration of another example of a possible layout of the first and second electrodes in the device of FIG. 2.

FIGS. 5 and 6 show two possible layouts of the first and second electrodes 222 and 224. In FIG. 5, both electrodes comprise a number of conductors with interconnected first ends and free second ends so as to be of substantially comb-like appearance. The conductors are arranged substantially parallel to one another, the conductors of the first electrode interdigitating with the conductors of the second electrode. In the embodiment of FIG. 6, the electrodes comprise a number of concentrically arranged conductive ring portions. Starting at the central point of the arrangement, the conductive ring portions belong alternately to the second and the first electrodes. It shall be noted that several other electrode layouts could be used for putting the present invention into practice.

Figure 7:
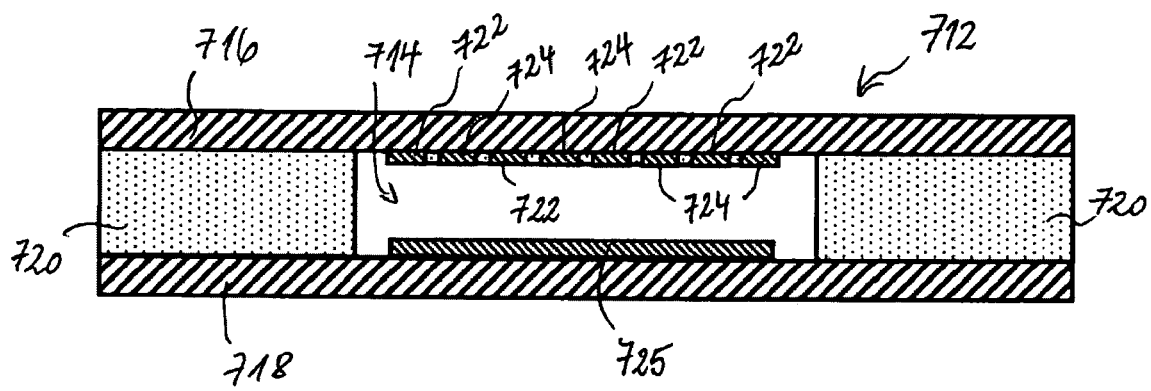
FIG. 7 is a schematic cross sectional view of a pressure sensor that can be used in a device according to the fifth aspect of the invention.

FIG. 7 shows a schematic of a film-based position sensor 712 of a data input device according to the fifth aspect of the invention. The position sensor 712 comprises first and second carrier films 716, 718 spaced apart by a spacer 720. The spacer 720 is provided with an opening delimiting an active zone 714 of the position sensor 712. The first carrier film 716 carries a first electrode 722 and a second electrode 724 on its inward-facing surface; the second carrier film 718 carries a third electrode 725 on its inward-facing surface. The third electrode 725 faces the first electrode 722 and the second electrode 724 in the active zone 714. The second and third electrodes are conductive electrodes. A top schematic view of the first and second electrodes is given in FIG. 8. Both the first and second electrodes 722, 724 are essentially comb-shaped. The first electrode 722 includes a series of resistively connected first conductors 758 arranged substantially parallel one to another. The resistive connection of the first conductors 758 is provided by a resistive strip 760. The second electrode 724 includes a series of conductively connected conductors 762, that interdigitate with the conductors of the first electrode 722. The third electrode 725 is not connected.

If a compressive force acts locally onto the position sensor, the first and second carrier films 716, 716 are pressed together and an electrical contact is established between one or more of the conductors 758 and the second electrode 724 via the third electrode 725. By measuring the resistance between one of the terminals 764 and 766 of the first electrode 722 and the second electrode 724 one can find the position where the first and second electrodes are in contact and thus where the force is acting on the sensor. More generally, one can measure any quantity indicative of the resistance between one of the terminals 764 and 766 and the second electrode 724 to obtain that information. In the data input device represented schematically in FIG. 8, this is achieved in that voltage source 743 of the control circuit 730 applies a DC potential difference between the terminals 764 and 766 of the first electrode 722. Voltage measurement circuit 746 then measures the voltage on the second electrode, which depends on the location of the contact point between the electrodes 722, 724 and 725.

Figure 9:
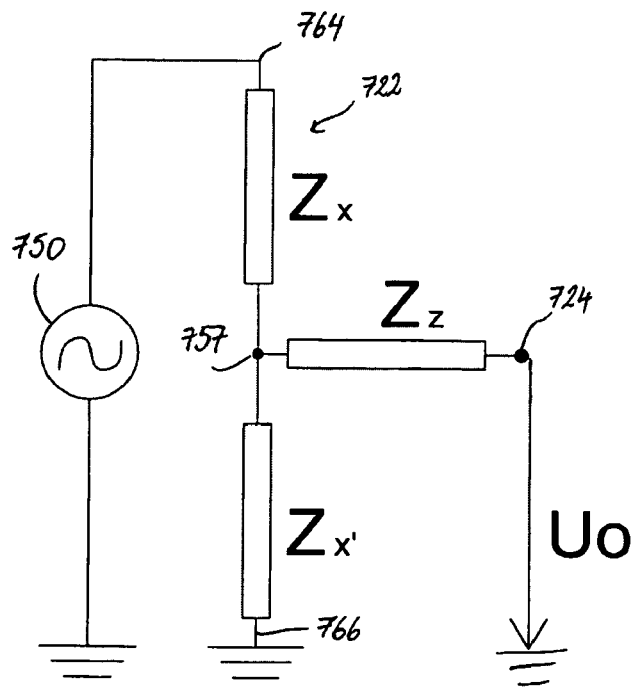
FIG. 9 is an equivalent circuit diagram of the device of FIG. 8 during the determination of the position of capacitive coupling.

The data input device 710 can also operate in "capacitive" detection mode. The alternating voltage source 750 of the control circuit 730 then applies an oscillating potential difference between the terminals 764 and 766 of the first electrode 722. The resulting oscillating voltage is measured at voltage measurement circuit 746 and indicates the location of capacitive coupling between the first and second electrodes 722 and 725. An equivalent circuit diagram representing this situation is given in FIG. 9. Capacitive coupling between the first and second electrodes 722 and 724 is illustrated as impedance $Z_Z$. The connection point 757 of impedance $Z_Z$ to the first electrode corresponds to the point, where capacitive coupling is highest, e.g. due to the proximity of a user's hand or finger. Because of the very high impedance of the voltage measurement circuit 746, the voltage $U_0$ detected by the voltage measurement circuit be approximated as $U_0 \sim U_{applied} \cdot Z_X / (Z_X + Z_{X'})$, where $U_{applied}$ is the voltage applied by the alternating voltage source 750. As the total impedance $Z_X + Z_{X'}$ of the first electrode is known, this expression immediately yields $Z_{X'}$ (and thus the position of capacitive coupling) as a function of the measured voltage $U_0$.

Figure 8:
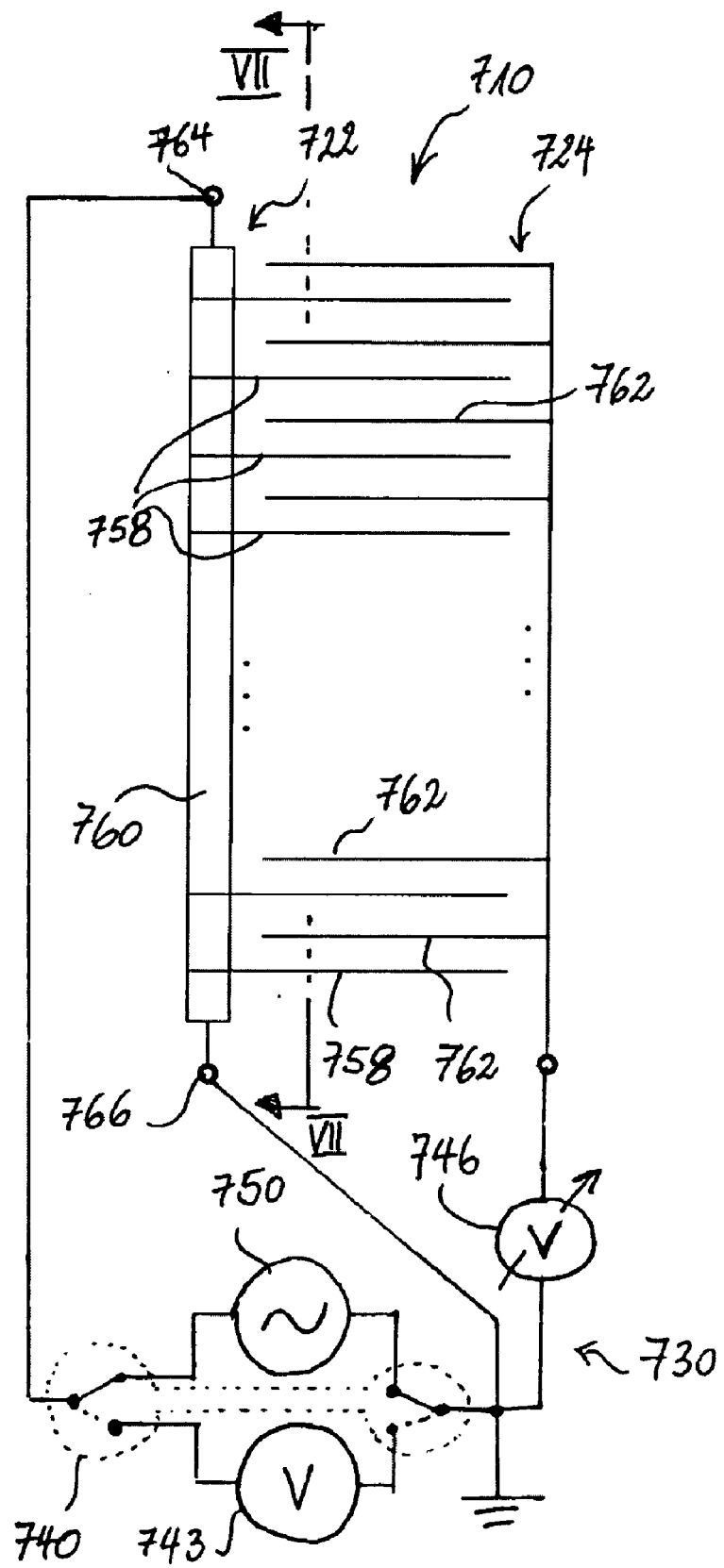
FIG. 8 is a schematic illustration of a data input device that uses the pressure sensor of FIG. 7.

The control circuit 730 comprises a switching unit 740 for switching between capacitive detection mode and resistive detection mode. In FIG. 8, the voltage measurement circuit 746 is shown being common to the two modes of operation. The control circuit 730 might, however, comprise separate voltage measurement circuit dedicated to a respective mode of operation of the circuit.

Figure 10:
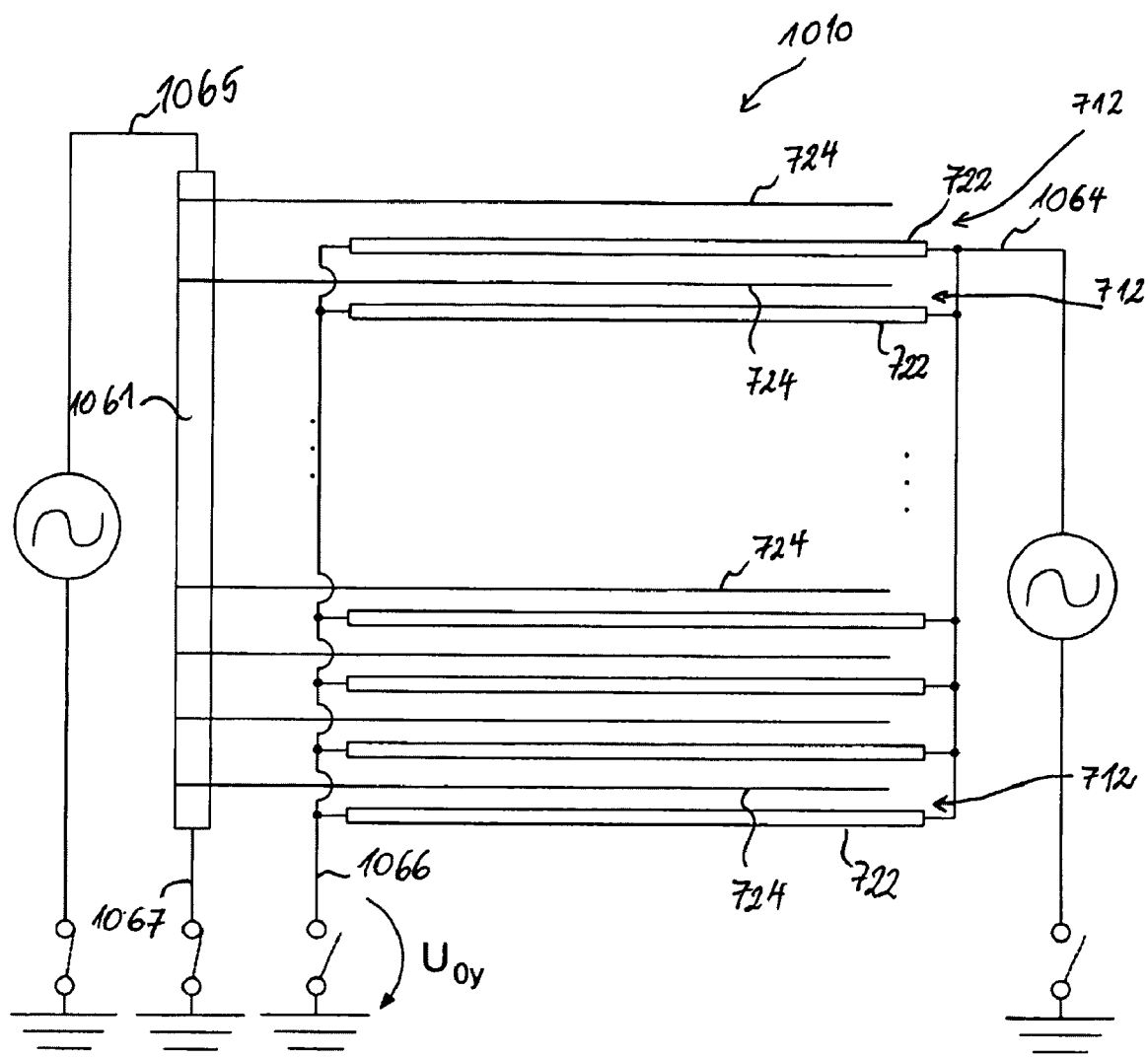
FIGS. 10 and 11 are schematics of a circuit of a data input device with a 2D position sensor.
Figure 11:
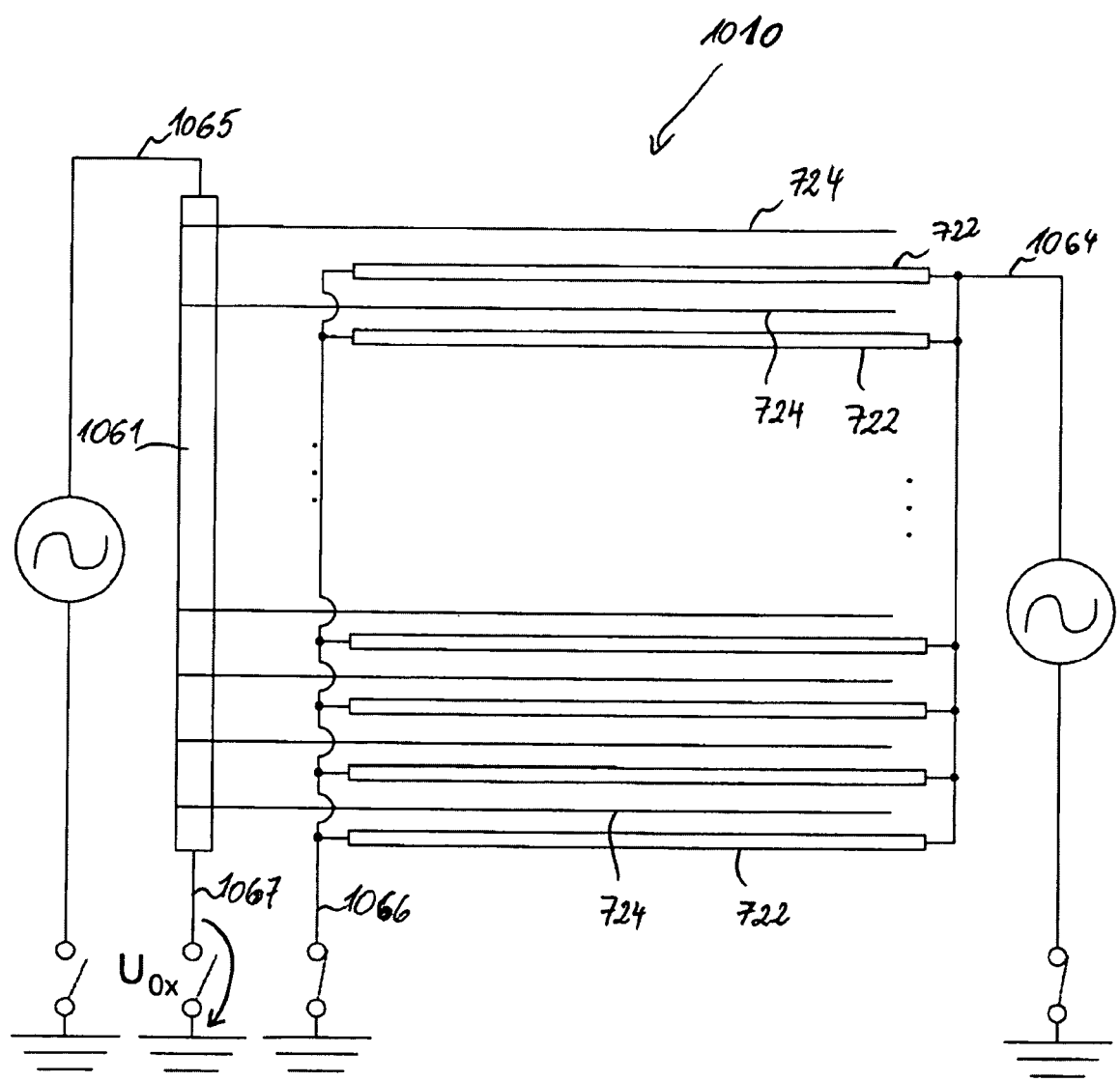

FIGS. 10 and 11 schematically illustrate a data input device 1010 comprising a plurality of position sensors 712 arranged in parallel. Data input device 1010 detects the position of a compressive force or capacitive coupling in two dimensions. The first electrodes 722 of the position sensors 712 are connected between two common terminals 1064 and 1066. The second electrodes 724 are resistively interconnected in series by means of a resistive strip 1061 between terminals 1065 and 1067.

Measuring the y-position of a compressive force or capacitive coupling is illustrated in FIG. 10. A voltage is applied between the terminals 1065 and 1067 and the resulting voltage $U_{0y}$ is measured at terminal 1066 (or at terminal 1064). The applied voltage is preferable a DC voltage in the case of the resistive measurement (for finding the y-position of the compressive force) and an AC voltage in case of the capacitive measurement (for finding the y-position of capacitive coupling). Measuring the x-position of a compressive force or capacitive coupling is illustrated in FIG. 11. A voltage is applied between the terminals 1064 and 1066 and the resulting voltage $U_{0x}$ is measured at terminal 1067 (or 1065). The applied voltage is preferable a DC voltage in the case of the resistive measurement (for finding the x-position of the compressive force) and an AC voltage in case of the capacitive measurement (for finding the x-position of capacitive coupling).

Figure 12:
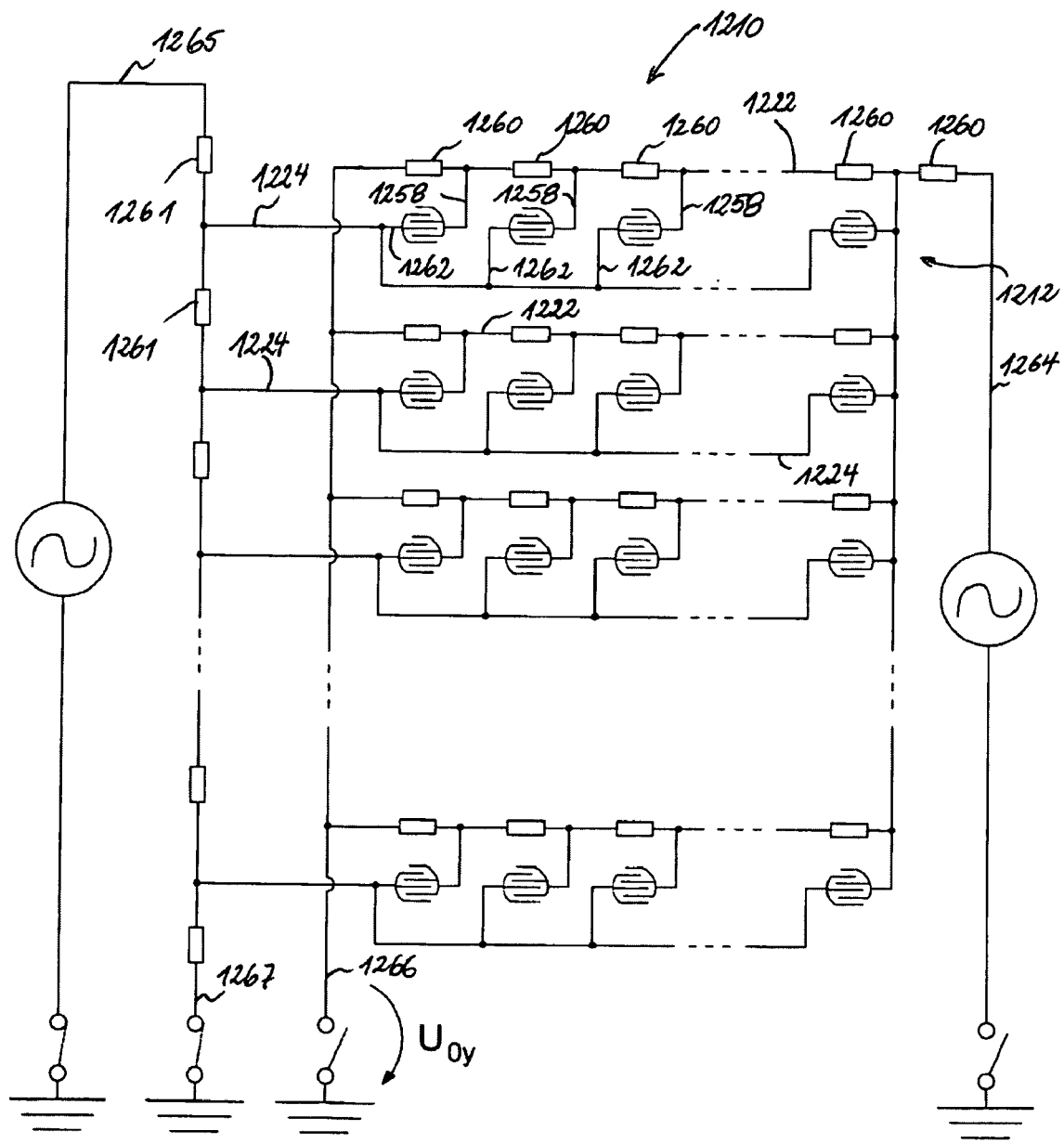
FIGS. 12 and 13 are schematics of a circuit of another data input device with a 2D position sensor.
Figure 13:
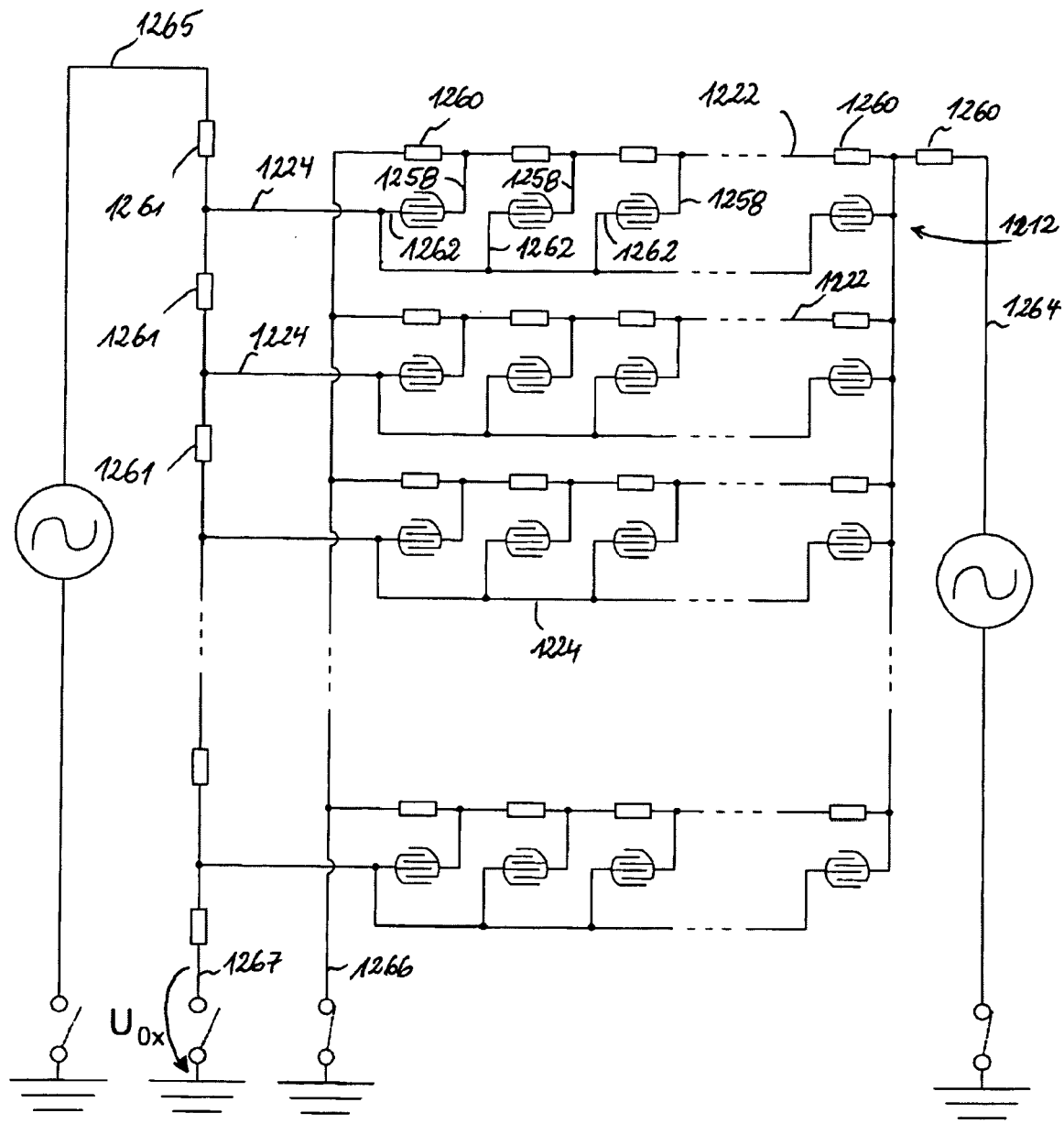

FIGS. 12 and 13 illustrate a variant of the data input device represented in FIGS. 10 and 11. In data input device 1210, the layout of the position sensors 712 differs from the layout previously discussed. The first electrodes 1222 comprise respectively a series of first conductors 1258 that are resistively interconnected. Unlike in the previous embodiments, the resistive interconnection is not provided through a continuous resistive strip but through discrete resistors 1260. The second electrodes comprise respectively a series of second conductors 1262 that are conductively interconnected. The first and second conductors protrude into the active zones of the position sensor and form therein interdigitating configurations. The first electrodes 1222 are connected between two common terminals 1264 and 1266. The second electrodes 1224 are resistively interconnected in series between terminals 1265 and 1267 by means of discrete resistors 1261.

Measuring the y-position of a compressive force or capacitive coupling is illustrated in FIG. 12. A voltage is applied between the terminals 1265 and 1267 and the resulting voltage $U_{0y}$ is measured at terminal 1266 (or at terminal 1264). The applied voltage is preferable a DC voltage in the case of the resistive measurement (for finding the y-position of the compressive force) and an AC voltage in case of the capacitive measurement (for finding the y-position of capacitive coupling). Measuring the x-position of a compressive force or capacitive coupling is illustrated in FIG. 13. A voltage is applied between the terminals 1264 and 1266 and the resulting voltage $U_{0x}$ is measured at terminal 1267 (or 1265). The applied voltage is preferable a DC voltage in the case of the resistive measurement (for finding the x-position of the compressive force) and an AC voltage in case of the capacitive measurement (for finding the x-position of capacitive coupling).

Figure 14:
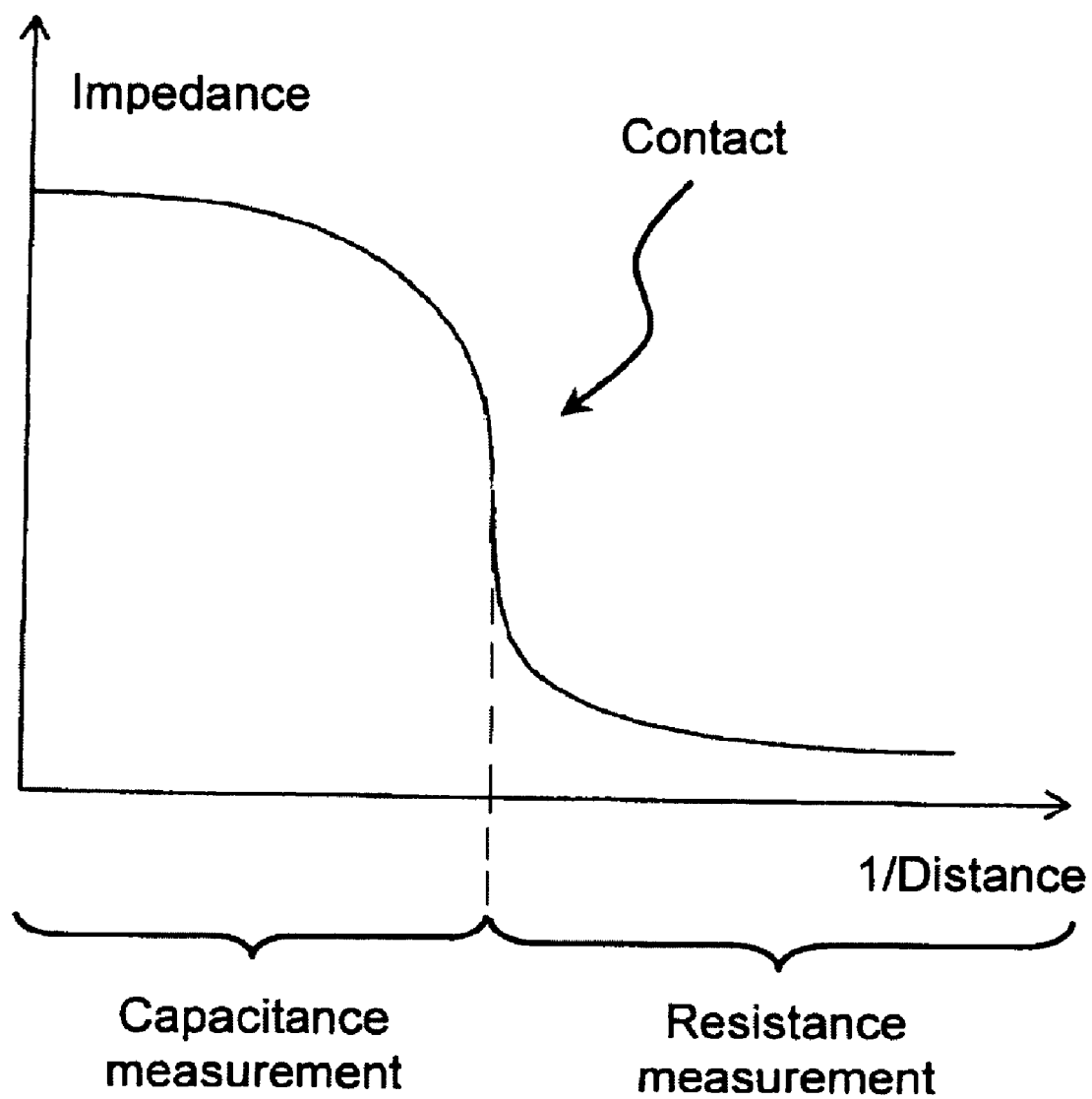
FIG. 14 is a schematic illustration of the impedance of the first electrode varying as a function of the distance of an actuating member.

FIG. 14 schematically illustrates the impedance between the first electrode and ground as a function of the distance of an actuating member (e.g. the user's finger, hand or any other body part) to the data input device. It is assumed, for the purpose of this explanation, that the first electrode is driven with a voltage at a fixed frequency. In FIG. 14, the distance decreases from left to right along the horizontal axis. If the actuating member is far away from the device, its impedance is maximum. As the actuating member approaches (without getting in contact with the device at this moment), the capacitance between the electrode and ground increases, so that the impedance decreases. As the actuating member gets even closer, it eventually presses onto the device, whereby the first and second electrodes are brought into contact. The capacitance remains now substantially constant but the resistance between the first and second electrodes now decreases with increasing pressure on the sensor. Consequently, the impedance decreases towards a minimum value. It should be noted that the device is advantageously switched from capacitance detection mode (second mode of operation) to resistance detection mode (first mode of operation) about when the actuating member comes into contact with the carrier film.

What is claimed is:

1. A data input device comprising a film-based pressure sensor with an active zone, said pressure sensor comprising a first carrier film, a second carrier film and a spacer arranged between said first and second carrier films for keeping the first and second carrier films at a distance from one another, said spacer comprising an opening delimiting said active zone, said first carrier film having a first electrode applied thereon, said second carrier film having a second electrode applied thereon, said first and second electrodes facing each other in said active zone in such a way that, in response to a compressive force acting on the active zone, the first and second carrier films are pressed together and an electrical contact is established between the first and second electrodes; and a control circuit able to operate in at least a first and a second mode of operation, said control circuit being configured so as to measure, in said first mode of operation, a quantity indicative of electrical resistance between said first and second electrodes for detecting an amount of compressive force acting on the active zone and, in said second mode of operation, a quantity indicative of a capacitance of said first electrode for detecting a person or an object approaching thereto.

2. A data input device according to claim 1, comprising a first module, dedicated to said first mode of operation, said first module comprising a current source operationally connected, in said first mode of operation, to said first and second electrodes so as to create a current through said first and second electrodes if an electrical contact is established between said first and second electrodes, and a voltage measurement circuit operationally connected, in said first mode of operation, to said first and second electrodes for measuring a voltage between them, said voltage being indicative of electrical resistance between said first and second electrodes.

3. A data input device according to claim 1, comprising a first module, dedicated to said first mode of operation, said first module comprising a voltage source operationally connected, in said first mode of operation, to said first and second electrodes for creating a voltage between them and a current measurement circuit operationally connected, in said first mode of operation, for measuring a current flowing through said first and second electrodes, said current being indicative of electrical resistance between said first and second electrodes.

4. A data input device according to claim 1, comprising a second module, dedicated to said second mode of operation, said second module including an AC voltage source operationally connected, in said second mode of operation, at least to said first electrode for applying an oscillating voltage to said first electrode and a current measurement circuit operationally connected, in said second mode of operation, for measuring an electrical current flowing into said first electrode, said electrical current flowing into said first electrode being indicative of a capacitance of said first electrode.

5. A data input device according to claim 4, wherein said AC voltage source is operationally connected to said first and second electrodes so as to apply voltages of substantially same phase and amplitude to said first and second electrodes, in said second mode of operation.

6. A data input device according to claim 1, wherein said control circuit comprises a first module, dedicated to said first mode of operation, a second module, dedicated to said second mode of operation, and a switching unit switching said control circuit between at least said first and second modes of operation.

7. A data input device as claimed in claim 1, wherein at least one of said first and second electrodes comprises a pressure sensitive layer arranged in facing relationship with the respective other one of said first and second electrodes in said active zone.

8. A data input device as claimed in claim 1, wherein said control circuit is configured so as to output a first output signal responsive to said quantity indicative of electrical resistance and a second output signal responsive to said quantity indicative of a capacitance of said first electrode.

9. A data input device as claimed in claim 8, wherein said control circuit comprises at least a first and a second output, said control circuit being configured so as to output said first output signal at said first output and said second output signal at said second output.

10. A data input device as claimed in claim 1, wherein said first electrode is subdivided into at least two electrode portions and wherein said at least two electrode portions are electrically separated at least in said second mode of operation, said quantity indicative of a capacitance of said first electrode being determined separately for each one of said at least two electrode portions.

11. In a data input device according to claim 1, a method comprising measuring a quantity indicative of electrical resistance between said first and second electrodes for detecting an amount of compressive force acting on the active zone; measuring a quantity indicative of a capacitance of said first electrode for detecting a person or an object approaching thereto.

12. A method as claimed in claim 11, wherein said measuring a quantity indicative of a capacitance of said first electrode includes applying an oscillating voltage to said first electrodes and measuring an electrical current flowing into said first electrode in response to said applied oscillating voltage.

13. A method as claimed in claim 11, wherein said measuring a quantity indicative of a capacitance of said first electrodes includes applying an oscillating voltage to said second electrode, the oscillating voltage applied to said second electrode having substantially same phase and amplitude as the oscillating voltage applied to said first electrode.

14. A data input device comprising a film-based pressure sensor with an active zone, said pressure sensor comprising a first carrier film, a second carrier film and a spacer arranged between said first and second carrier films for keeping the first and second carrier films at a distance from one another, said spacer comprising an opening delimiting said active zone, said first carrier film having a first electrode and a second electrode applied thereon, said second carrier film having a third electrode applied thereon, said first and second electrodes facing said third electrode in said active zone in such a way that, in response to a compressive force acting on the active zone, the first and second carrier films are pressed together and an electrical contact is established between the first and second electrodes via said third electrode, and a control circuit able to operate in at least a first and a second mode of operation, said control circuit being configured so as to measure, in said first mode of operation, a quantity indicative of electrical resistance between said first and second electrodes for detecting an amount of compressive force acting on the active zone and, in said second mode of operation, a quantity indicative of a capacitance of at least one of said first, second and third electrodes for detecting a person or an object approaching thereto.

15. A data input device according to claim 14, comprising a first module, dedicated to said first mode of operation, said first module comprising a current source operationally connected, in said first mode of operation, to said first and second electrodes so as to create a current through said first and second electrodes if an electrical contact is established between said first and second electrodes via said third electrode, and a voltage measurement circuit operationally connected, in said first mode of operation, at said first and second electrodes for measuring a voltage between them, said voltage being indicative of electrical resistance between said first and second electrodes.

16. A data input device according to claim 14, comprising a first module, dedicated to said first mode of operation, said first module comprising a voltage source operationally connected, in said first mode of operation, at said first and second electrodes for creating a voltage between them and a current measurement circuit operationally connected, in said first mode of operation, for measuring a current flowing through said first and second electrodes, said current being indicative of electrical resistance between said first and second electrodes.

17. A data input device according to claim 14, comprising a second module, dedicated to said second mode of operation, said second module including an AC voltage source operationally connected, in said second mode of operation, at least to said at least one of said first, second and third electrodes for applying an oscillating voltage to said at least one of said first, second and third electrodes and a current measurement circuit operationally connected, in said second mode of operation, for measuring an electrical current flowing into said at least one of said first, second and third electrodes, said electrical current flowing into said at least one of said first, second and third electrodes being indicative of a capacitance of said at least one of said first, second and third electrodes.

18. A data input device according to claim 17, wherein said AC voltage source is operationally connected to said first, second and third electrodes so as to apply voltages of substantially same phase and amplitude to said first, second and third electrodes, in said second mode of operation.

19. A data input device according to claim 14, wherein said control circuit comprises a first module, dedicated to said first mode of operation, a second module, dedicated to said second mode of operation, and a switching unit switching said control circuit between at least said first and second modes of operation.

20. A data input device as claimed in claim 14, wherein at least one of said first, second and third electrodes comprises a pressure sensitive layer arranged in facing relationship with a respective other one or respective other ones of said first, second and third electrodes in said active zone.

21. A data input device as claimed in claim 14, wherein said control circuit is configured so as to output a first output signal responsive to said quantity indicative of electrical resistance and a second output signal responsive to said quantity indicative of a capacitance of said at least one of said first, second and third electrodes.

22. A data input device as claimed in claim 21, wherein said control circuit comprises at least a first and a second output, said control circuit being configured so as to output said first output signal at said first output and said second output signal at said second output.

23. A data input device as claimed in claim 14, wherein said at least one of said first, second and third electrodes is said first electrode.

24. A data input device as claimed in claim 14, wherein said at least one of said first, second and third electrodes is said first and second electrodes.

25. A data input device as claimed in claim 14, wherein said at least one of said first, second and third electrodes is said third electrode.

26. A data input device as claimed in claim 14, wherein said at least one of said first, second and third electrodes is subdivided into at least two electrode portions and wherein said at least two electrode portions are electrically separated at least in said second mode of operation, said quantity indicative of a capacitance of at least one of said first, second and third electrodes being determined separately for each one of said at least two electrode portions.

27. In a data input device according to claim 14, a method comprising measuring a quantity indicative of electrical resistance between said first and second electrodes for detecting an amount of compressive force acting on the active zone; measuring a quantity indicative of a capacitance of said at least one of said first, second and third electrodes for detecting a person or an object approaching thereto.

28. A method as claimed in claim 27, wherein said measuring a quantity indicative of a capacitance of said at least one of said first, second and third electrodes includes applying an oscillating voltage to said at least one of said first, second and third electrodes and measuring an electrical current flowing into said at least one of said first, second and third electrodes in response to said applied oscillating voltage.

29. A method as claimed in claim 27, wherein said measuring a quantity indicative of a capacitance of said at least one of said first, second and third electrodes includes applying an oscillating voltage to the other one or other ones of said at least one of said first, second and third electrodes, the oscillating voltage applied to said other one or other ones of said at least one of said first, second and third electrodes having same phase and amplitude as the oscillating voltage applied to said at least one of said first, second and third electrodes.

30. A data input device comprising a film-based position sensor with an active zone, said position sensor comprising a first carrier film, a second carrier film and a spacer arranged between said first and second carrier films for keeping the first and second carrier films at a distance from one another, said spacer comprising an opening delimiting said active zone, said first carrier film having a first electrode and a second electrode applied thereon, said second carrier film having a third electrode applied thereon, said first electrode including a series of resistively connected first conductors, said third electrode facing said first electrode and said second electrode in said active zone in such a way that, in response to a compressive force acting on the active zone, the first and second carrier films are pressed together and an electrical contact is established between one or more of said first conductors and said second electrode via said third electrode; and a control circuit able to operate in at least a first and a second mode of operation, said control circuit being configured so as to measure, in said first mode of operation, a quantity indicative of a position of resistive coupling between said first electrode and said second electrode for detecting a position of a compressive force acting on the active zone and, in said second mode of operation, a quantity indicative of a position of capacitive coupling between said first electrode and said second electrode for detecting a position of a person or an object approaching to said data input device.

31. A data input device as claimed in claim 30, wherein said second electrode comprises a series of conductively connected second conductors, said first and second conductors being arranged so as to interdigitate.

32. A data input device comprising a film-based position sensor with a plurality of active zones, said position sensor comprising a first carrier film, a second carrier film and a spacer arranged between said first and second carrier films for keeping the first and second carrier films at a distance from one another, said spacer comprising at least one opening delimiting said active zones, said first carrier film having a first electrode and a second electrode applied thereon in each one of said active zones, said second carrier film having a third electrode applied thereon in each one of said active zones, each first electrode including a series of resistively connected first conductors, each third electrode facing a respective first electrode and a respective second electrode in a respective active zone in such a way that, in response to a compressive force acting on at least one of said active zones, the first and second carrier films are pressed together and an electrical contact is established between one or more of the first conductors of the first electrode of the at least one of said active zones on which the compressive force acts and a respective second electrode via a respective third electrode; and a control circuit able to operate in at least a first and a second mode of operation, said control circuit being configured so as to measure, in said first mode of operation, a quantity indicative of a position in two dimensions of resistive coupling between said first electrode and said second electrode for detecting a position in two dimensions of a compressive force acting on at least one of the active zones and, in said second mode of operation, a quantity indicative of a position of capacitive coupling between said first electrode and said second electrode for detecting a position of a person or an object approaching to said data input device.

33. A data input device including a film-based pressure sensor, the pressure sensor comprising an active zone, a first carrier film, a second carrier film and a spacer arranged between the carrier films for keeping them at a distance from one another, the spacer having an opening delimiting said active zone, in which a first and a second electrodes are arranged in such a way that, in response to a compressive force acting on the active zone, an electrical contact is established between the first and second electrodes, control circuit able to operate in at least a first and a second mode of operation, said control circuit being configured so as to measure, in the first mode of operation, a quantity indicative of electrical resistance between the first and second electrodes for detecting an amount or a position of a compressive force acting on the active zone and, in the second mode of operation, a quantity indicative of a capacitance for detecting a person or an object approaching thereto.

* * * * *